United States Patent [19]

Yonezu

[11] 4,210,878

[45] Jul. 1, 1980

[54] SEMICONDUCTOR LASER ELEMENT HAVING A UNITARY FILM ON A LASER CRYSTAL AND A HEAT SINK THEREOF

[75] Inventor: Hiroo Yonezu, Tokyo, Japan

[73] Assignee: Nippon Electric Co., Ltd., Tokyo, Japan

[21] Appl. No.: 940,305

[22] Filed: Sep. 6, 1978

Related U.S. Application Data

[63] Continuation-in-part of Ser. No. 760,373, Jan. 18, 1977, abandoned.

[30] Foreign Application Priority Data

Jan. 20, 1976 [JP] Japan .................................... 51-5336

[51] Int. Cl.² .............................................. H01S 3/19
[52] U.S. Cl. ................................. 331/94.5 H; 29/590; 357/18; 357/72
[58] Field of Search ...................... 331/94.5 H, 94.5 P; 357/18, 72; 228/110; 29/588, 589, 590

[56] References Cited

U.S. PATENT DOCUMENTS

| | | | |
|---|---|---|---|
| 3,733,561 | 5/1973 | Hayashi | 331/94.5 H |
| 3,733,685 | 5/1973 | Kauppila | 228/110 |
| 3,935,083 | 1/1976 | Tomozawa et al. | 357/72 X |

OTHER PUBLICATIONS

H. Kressel et al., "Reliability Aspects and Facet Damage in High-Power Emission from (AlGa)As CW Laser Diodes at Room Temperature", RCA Review, vol. 36, Jun. 1975, pp. 230–239.

*Primary Examiner*—James W. Davie
*Attorney, Agent, or Firm*—Hopgood, Calimafde, Kalil, Blaustein & Lieberman

[57] ABSTRACT

In a semiconductor laser element, a semiconductor laser crystal having a pair of reflection surfaces and a pair of opposing principal surfaces is fused to a heat sink having a planar surface wider than each of the principal surfaces by a layer formed of a fusible metal on the planar surface, whereby one of the ohmic contacts formed on predetermined areas of the principal surfaces is brought into contact with a predetermined portion of the fusible metal layer. A unitary film of an electrically insulating material, such as silicon monoxide, silicon dioxide, silicon nitride, and/or aluminium oxide, is sputtered or otherwise formed continuously on the reflection surfaces and on the exposed portion of the fusible metal layer left uncovered by the laser crystal fused to the heat sink. After the unitary film is formed on the other of the contacts, it is still possible to bond a metal lead directly to the other contact by employing an ultrasonic bonding technique. The fusible metal may be indium, tin, a solder, or a gold-tin, gold-silicon, or gold-germanium alloy, all of which are fusible at a temperature below about 370° C. The laser crystal may be a double or single heterojunction or a homojunction crystal of lead sulfide or telluride or an intermetallic compound, such as $GaAs-Al_xGa_{1-x}As$. The heat sink may be made of silicon, diamond of the IIa type, or copper.

11 Claims, 1 Drawing Figure

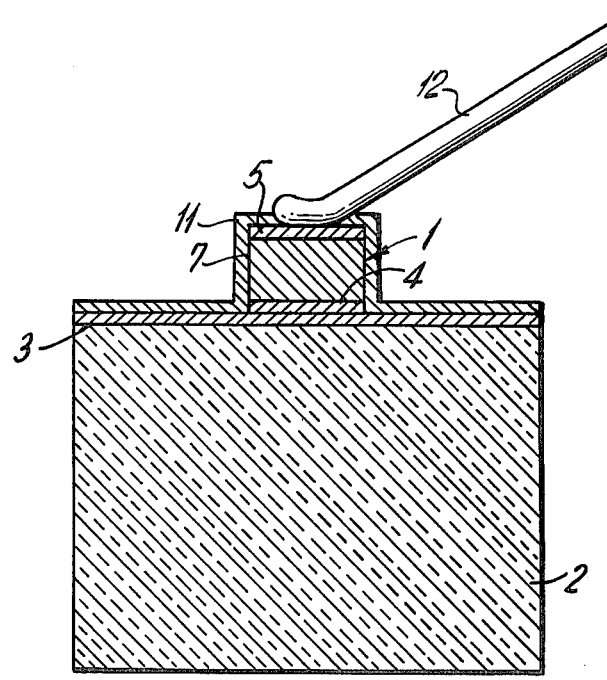

SEMICONDUCTOR LASER ELEMENT HAVING A UNITARY FILM ON A LASER CRYSTAL AND A HEAT SINK THEREOF

CROSS-REFERENCE TO A RELATED APPLICATION

The instant application is a continuation-in-part application of a copending patent application Ser. No. 760,373 filed Jan. 18, 1977, now abandoned.

BACKGROUND OF THE INVENTION

This invention relates to a semiconductor laser element comprising a semiconductor laser crystal and a heat sink.

A conventional semiconductor laser element comprises a semiconductor laser crystal attached to a heat sink. The laser element is further attached to a larger heat sink to form a semiconductor laser. When used as a semiconductor laser crystal, a GaAs-$Al_xGa_{1-x}As$ double heterojunction crystal is featured by its capability of producing a continuous optical output at room temperature. This material is being put into use in lasers since the crystal defects that once were found in these crystals and, which resulted in the deterioration of laser performance, have been largely eliminated. The exposed reflection surfaces (Fabry-Pérot reflection surfaces) of the laser crystal, however, undergo deterioration when the semiconductor laser is continously kept in operation for more than 1,000 hours and deterioration of laser operation has been found to result from a gradual erosion and degeneration during the operation of an active layer which has ends exposed on the reflection surfaces. The damage caused to the exposed active layer ends is serious when the laser is put into operation in a more humid and oxidizing atmosphere, which atmosphere is unavoidable in many practical applications of semiconductor lasers.

It has therefore been proposed to protect the active layer ends against the atmosphere by the provision of a thin covering film as described, for example, in an article contributed by H. Kressel et al in "RCA Review," Volume 36, pages 230–239 (June, 1975), under the title of "Reliability Aspects and Facet Damage in High-Power Emission from (AlGa)As CW Laser Diodes at Room Temperature." A similar protective film is described by Akihiro Tomozawa et al for a plurality of transistors, an IC, and an LSI in U.S. Pat. No. 3,935,083. No effective covering film, however, has yet been realized for a semiconductor laser crystal.

An attempt has also been made to adjust the reflectivity of each reflection surface by covering the reflection surface with a dielectric film of a suitable thickness. The dielectric material may be silicon monoxide, silicon dioxide, or the like. Yet another attempt made has been to evaporate a metal film on the dielectric film to achieve perfect reflection. It is also known that a dielectric film formed on each reflection surface of a semiconductor laser crystal to reduce the reflectivity rather than raise the same is effective in avoiding the so-called optical or mirror-surface damage, which is an instantaneous damage caused, on making the laser crystal produce a large optical output, to the reflection surfaces by the intensity of the produced light besides the gradual deterioration of the exposed active layer ends. The reduction in the reflectivity renders the production of the optical output easier (reduces the light intensity within the laser crystal) and thereby avoids the optical damage.

Each reflection surface of a semiconductor laser crystal is about 100×100 to 200 microns wide and the active layer end exposed in each reflection surface is about 5×100 to 200 microns wide. The dielectric film should be sufficiently wide to cover each exposed active layer end. In practice, the dielectric film is generally formed on the whole reflection surface because of the difficulty of forming the dielectric film only on the limited areas of the exposed active layer ends. Even if it were formed on the entire reflection surface, the dielectric film is still insufficient to protect the reflection surfaces against deterioration or damage. A semiconductor laser for producing a continuous optical output at room temperature is subjected to very severe conditions of operation and is mainly referred to hereunder as an example of a semiconductor laser because the protection of the exposed reflection surfaces of a semiconductor laser crystal of such a laser well applies to the protection of other semiconductor laser crystals.

A conventional semiconductor laser crystal for producing a continuous optical output at room temperature is attached to a heat sink of, for example, diamond of the IIa type or copper by an interposed tin or indium layer. The tin plating shown in U.S. Pat. No. 3,733,561 issued to Izuo Hayashi on a diamond heat sink appears to show such an interposed layer. the attaching step is carried out at a temperature of about 250° C. for tin or of about 200° C. for indium so as not to undesirably introduce strains into the laser crystal. The above-mentioned dielectric film is attached to the laser crystal surfaces prior to the attachment of the laser crystal to the heat sink. Inasmuch as the dielectric film does not sufficiently tenaciously adhere to the crystal surfaces by nature and has a coefficient of thermal expansion that is different from that of the laser crystal, either the film tends to exfoliate from the crystal surfaces or the strength of adherence of the film to the crystal surfaces is considerably weakened during the subjection of the semiconductor laser crystal to a heat cycle of in the laser crystal attaching step. Even when the laser crystal is placed on the heat sink, the dielectric film is often damaged by the pincette, which is used in this operation, or is otherwise contaminated. Furthermore, it is very difficult and barely possible, even with an objectionably low yield to form a dielectric film on such a small area as exemplified hereinabove. These disadvantages of the conventional dielectric film are also present in the thin covering film formed on each reflection surface to protect the exposed active layer end from the atmosphere. in addition, an interposed tin or indium layer is oxidized in a humid and oxidizing atmosphere to reduce its strength of attaching the semiconductor laser crystal to the heat sink, thereby to shorten the operation and storage life of the semiconductor laser.

SUMMARY OF THE INVENTION

It is therefore an object of the present invention to provide a semiconductor laser element and a method of manufacturing the same wherein a film of an electrically insulating material formed on a semiconductor laser crystal of the element tenaciously adheres to the reflection surfaces of the laser crystal.

It is another object of this invention to provide a semiconductor laser element of the type described wherein the film also protects that exposed portion of a layer of a fusible metal formed on a heat sink of the laser element which lies uncovered by the laser crystal fused to the heat sink by the remaining portion of the fusible metal layer.

It is still another object of this invention to provide a method of manufacturing the laser element of the type described in the next preceding paragraph.

It is a further object of this invention to provide a semiconductor laser element of the type described, which has a long operation and storage life even in a humid and oxidizing atmosphere, and a method of manufacturing such a semiconductor laser element.

The semiconductor laser element according to the invention comprises a semiconductor laser crystal having a pair of opposing reflection surfaces and a pair of opposing principal surfaces. The laser element further comprises a pair of ohmic contacts at least on predetermined areas of the respective principal surfaces, a heat sink having a planar surface wider than each of the principal surfaces of the laser crystal, and a layer of a fusible metal on the planar surface of the heat sink. The fusible metal, as it is referred to herein, is fusible at a temperature below about 370° C. The laser crystal is fused to the heat sink by the fusible metal layer with one of the contacts brought into contact with a predetermined portion of the fusible metal layer. The fusible metal layer thus has an exposed portion that is left uncovered by the laser crystal fused to the heat sink. The laser element still further comprises a unitary film of an electrically insulating material continuously at least on the reflection surfaces of the laser crystal and on the exposed portion of the fusible metal layer.

According to this invention, there is also provided a method of manufacturing a semiconductor laser element comprising the steps of providing a semiconductor laser crystal having a pair of opposing reflection surfaces and a pair of opposing principal surfaces, forming a pair of ohmic contacts at least on predetermined areas of the respective principal surfaces, providing a heat sink having a planar surface wider than each of the principal surfaces of the laser crystal, forming a layer of a fusible metal on the planar surface of the heat sink, and fusing at least a portion of the fusible metal layer to fuse the laser crystal having the contacts to the heat sink with one of the contacts brought into contact with a predetermined portion of the fusible metal layer, followed by the step of forming a unitary film of an electrically insulating material continuously at least on that exposed portion of the fusible metal layer which is left uncovered by the laser crystal fused to the heat sink. The fusible metal as referred to herein is fusible at a temperature below about 370° C.

BRIEF DESCRIPTION OF THE DRAWING

The sole FIGURE is an enlarged schematic sectional view of a semiconductor laser element according to an embodiment of the present invention.

DESCRIPTION OF THE PREFERRED EMBODIMENTS

Referring to the single FIGURE, a semiconductor laser element according to an embodiment of the present invention comprises a GaAs-$Al_xGa_{1-x}$As double heterojunction laser crystal 1 and a rectangular parallelepiped heat sink 2 of diamond of the IIa type having six planar surfaces metallized by an Au/Cr layer (not separately depicted) formed on each planar surface. A tin layer 3 of a thickness of about three microns is evaporated onto that metallized planar surface of the heat sink 2 onto which the laser crystal 1 is to be subsequently fused. The laser crystal 1 is about 200×300×100 microns in dimensions. The pair of opposing (200×300)-micron surfaces or facets of the laser crystal 1 is herein designated the principal surfaces of the laser crystal. The planar surface of the heat sink 2 to which the laser crystal 1 is to be fused is wider than each of the principal surfaces. An Au/Cr layer 4 and an Au-Ge-Ni layer 5 are formed at least on predetermined areas of the principal surfaces to provide a p-type and an n-type ohmic contact, respectively, with the laser crystal 1. The notation Au/Cr, used for a layer, represents a composite layer of a gold layer superposed on an underlying chromium layer. The notation Au-Ge-Ni represents an alloy, as known in the art, of gold, germanium, and nickel. An aluminium layer (not separately shown), about two microns thick, is evaporated onto the Au-Ge-Ni layer 5 for the purpose shortly to be described. The laser crystal 1 is placed on the tin layer 3 with the Au/Cr layer 4 brought into contact with a predetermined portion of the tin layer 3 and is heated to a temperature of about 250° C. in a hydrogen atmosphere. The tin layer 3 is fused at least partly at the surface area of the predetermined portion. The laser crystal 1 is thereby fused to the heat sink 2 with an exposed portion of the tin layer 3 left uncovered by the laser crystal 1 thus attached to the heat sink 2. It will be understood that the exposed portion is the tin layer 3 except for the predetermined portion when the Au/Cr layer 4 is formed on the whole area of one of the principal surfaces.

Further referring to the sole FIGURE, a pair of opposing (100×200)-micron surfaces of the laser crystal 1 serve as a pair of opposing reflection surfaces 7. The principal surfaces are thus substantially perpendicular to the reflection surfaces 7. After the fusing step of the laser crystal 1 to the heat sink 2, a film 11 of silicon dioxide is sputtered simultaneously onto the reflection surfaces 7 and onto the exposed portion of the tin layer 3 to a thickness of about 1000 Å. The silicon dioxide film 11 thus provides a unitary film that continuously covers the reflection surfaces 7 and the exposed portion of the tin layer 3. It will be understood from the single FIGURE that the unitary film 11 is formed also on the aluminium layer evaporated onto the Au-Ge-Ni layer 5. Thereafter, an aluminium lead 12 is bonded to the aluminium layer to serve as a negative electrode. By restoring to an ultrasonic bonding technique known in the art, it is possible to bring the lead 12 into direct contact with the Au-Ge-Ni layer 5 with the unitary film 11 partly broken at a portion juxtaposed to the portion at which the lead 12 is bonded to the layer 5. The heat sink 2 is attached, in turn, to a larger heat sink (not shown) that serves as a positive electrode. With respect to the above-mentioned predetermined portion of the tin layer 3, the laser crystal 1 is preferably fused to the heat sink 2 with one of the reflection surfaces 7 rendered coplanar with one of the heat sink side surfaces although the laser element is operable even with the laser crystal 1 fused to the heat sink 2 in the manner depicted in the FIGURE.

The unitary film 11 may be formed of silicon monoxide, silicon nitride, or aluminium oxide. Alternatively, it is possible to form the film 11 as a composite film of at least two of the exemplified materials including silicon dioxide as already mentioned. The film 11 may be formed by thermal decomposition, plasma technique, coating, or any other of the known methods. The film 11 may be as thin as only several hundred angstroms if it is desired merely to protect the laser element against the atmosphere. A unitary film 11 of a thickness of about 1000 Å as mentioned above also serves well as a dielectric film for adjusting the reflectivity of each of the reflection surfaces 7.

The laser crystal 1 may be fused by the use of the tin layer 3 to the heat sink 2 at a temperature between about 240° C. and 280° C. Instead of tin, it is also possible to use a fusible metal that is fusible at a temperature below about 370° C. Such a fusible metal may be indium fusible at a temperature above about 157° C., such as 200° C., a solder consisting essentially of 73.9% of lead and 26.1% of tin and fusible at a temperature of about 183° C., an Au-Sn alloy consisting essentially of 29.3% of gold and 70.7% of tin and fusible at a temperature of about 280° C., an Au-Si alloy consisting essentially of 31% of gold and 69% of silicon and fusible at a temperature of about 370° C., or an Au-Ge alloy consisting essentially of 27% of gold and 73% of germanium and fusible at a temperature of about 356° C., the percentages being by mol. The tin layer 3 is referred to as a fusible metal layer 3 hereunder.

The unitary film 11 of an electrically insulating material is very effective in preventing the otherwise exposed reflection surfaces 7 from deteriorating even in a humid and oxidizing atmosphere. Without the unitary film 11, both ends of the active layer (not shown) of the laser crystal 1 are exposed on the respective reflection surfaces 7 to the atmosphere. It is believed that the surface deterioration mainly results from the fact that the material of the active layer is deteriorated or damaged as a result of the chemical reaction with the atmosphere of each exposed end of the active layer along which an electric current flows and across which an electric field is applied. The film 11 prevents the occurrence of the chemical reaction.

The unitary film 11 is also effective in protecting the fusible metal layer 3. Without the film 11, the fusible metal layer 3 is subject to oxidation as previously discussed. The fusible metal layer 3 is also subject to secular changes, which cause defects generally occuring at the periphery of the fusible metal layer 3 and proceeding to the portion at which the laser crystal 1 is fused to the heat sink 2. In any event, the defects adversely affect the ability of the fusible metal layer 3 of fusing or attaching the laser crystal 1 to the heat sink 2, which would cause laser crystal to come off the heat sink. The unitary film 11 prevents the occurrence of such defects.

The unitary film 11 very tenaciously adheres to the reflection surfaces 7 of the laser crystal 1 and to the above-mentioned exposed portion of the fusible metal layer 3. The film 11 is not subjected to the heat cycle to which a similar film separately formed on each of the reflection surfaces 7 has conventionally been subjected during attachment of the laser crystal 1 to the heat sink 2. Consequently, the film 11 will not exfoliate from the reflection surfaces 7. Nor is the strength of adhesion of the film 11 adversely affected. The adhesion of the film 11 to the reflection surfaces 7 is particularly excellent when the active layer contains a small amount of aluminum as is the case with the illustrated GaAs-$Al_xGa_{1-x}As$ crystal because the active layer and its adjacency are formed under the circumstances of mixed $Al_xGa_{1-x}As$ crystals which are chemically active and to which the film 11 shows excellent adhesion.

Furthermore, the unitary film 11 is formed continuously on the reflection surfaces 7 of the laser crystal 1 and the exposed portion of the fusible metal layer 3. Formation of the film 11 is thus easier than the formation of a similar film only on each of the reflection surfaces 7 of a very narrow area. The surfaces of the laser crystal 1 are liable to damage such as a scratch in a laser crystal surface, which is often fatal to the operation of the laser element. In contrast, damage in a heat sink surface hardly adversely affects the laser performance. On forming the above-mentioned similar film, the laser crystal 1 has to be handled, as by a pincette, individually. This is troublesome and may result in fatal damage to the laser. It is, however, possible to deal with the heat sink 2 instead of the laser crystal 1 on forming the unitary film 11. Even though the laser crystal 1 is individually handled while carrying out the laser crystal fusing step, there is no danger of damaging the similar film preliminarily formed on each of the reflection surfaces 7 according to the prior art. As a result, the yield of manufacture of semiconductor laser elements is considerably increased according to this invention. The methods exemplified hereinabove of forming the unitary film 11 make it possible to simultaneously deal with a plurality of semiconductor laser elements, from several hundreds to several thousands in number. As a further result, the efficiency of production of the semiconductor elements is raised according to this invention.

Because of the continuous coverage of the reflection surfaces 7 and the exposed portion of the fusible metal layer 3, the unitary film 11 serves to lengthen the operation and storage life of semiconductor laser elements according to this invention. The laser elements show excellent performance even after a continued operation of several thousand hours in a humid and oxidizing atmosphere, even without an appreciable reduction in the strength of adhesion of the film 11 to the reflection surfaces 7 or to the exposed portion of the fusible metal layer 3. Even if the unitary film 11 is formed also on the aluminium layer on the Au-Ge-Ni layer 5, this does not cause any serious trouble. As described, it is possible to bond the aluminium lead 12 directly to the Au-Ge-Ni layer 5 without much difficulty. Depending on the material and the thickness of the film 11, it is only necessary to preliminarily scrape a linear portion of the film 11 on the Au-Ge-Ni layer 5 by a scriber before bonding the aluminium lead 12 to the layer 5. The lead 12 may be of any other known material and be bonded to the Au-Ge-Ni layer 5 by any of the known techniques.

The laser crystal 1 may be a double or single heterojunction or a homojunction crystal of any known semiconductor material or materials other than GaAs-$Al_xGa_{1-x}As$ exemplified in the description of the preferred embodiments. For example, the laser crystal 1 may be of lead sulfide, lead telluride, $In_xGa_{1-x}As_yP_{1-y}In_pGa_{1-p}As_qP_{1-q}$, or $Pb_zSn_{1-z}Te$-$Pb_rSn_{1-r}Te$. Furthermore, the laser crystal 1 may be of the stripe type or of the type capable of producing an optical output from the whole area of one of the reflection surfaces 7. The heat sink 2 may also be made of silicon, molybdenum, copper, silver, or gold. Moreover, an indium layer is suitable as the fusible metal layer 3 for a heat sink 2 of copper, silver, or gold.

What is claimed is:

1. A semiconductor laser element comprising a semiconductor laser crystal having a pair of opposing reflection surfaces and a pair of opposing principal surfaces, a pair of ohmic contacts at least on predetermined areas of the respective principal surfaces, a heat sink having a planar surface wider than each of said principal surfaces of said laser crystal, a layer of a fusible metal on said planar surface of said heat sink, said fusible metal being fusible at a temperature below about 370° C., said laser crystal being fused to said heat sink by said fusible metal layer with one of said contacts brought into contact with a predetermined portion of said fusible metal layer, said fusible metal layer thereby having an exposed portion that is left uncovered by the laser crystal fused to said heat sink, and a unitary film of an electrically insulating material continuously covering at least said reflection surfaces of said laser crystal and said exposed portion of said fusible metal layer.

2. A semiconductor laser element as claimed in claim 1, wherein said electrically insulating material is at least one member selected from the group consisting of silicon monoxide, silicone dioxide, silicon nitride, and aluminium oxide.

3. A semiconductor laser element as claimed in claim 2, wherein said unitary film has a thickness between several hundred angstroms and about one thousand angstroms.

4. A semiconductor laser element as claimed in claim 3, further comprising a metal lead bonded to a portion of the other of said contacts, wherein said unitary film further covers said other contact except said portion of said other contact.

5. A semiconductor laser element as claimed in claim 1, manufactured by a method comprising the steps of providing said laser crystal, forming said ohmic contacts at least on predetermined areas of the respective principal surfaces, providing said heat sink, forming said fusible metal layer on the planar surface of said heat sink, fusing at least a portion of said fusible metal layer to fuse the laser crystal having said contacts to said heat sink with one of said contacts brought into contact with the predetermined portion of said fusible metal layer, and thereafter forming said unitary film continuously at least on said reflection surfaces of said laser crystal and on said exposed portion of said fusible metal layer.

6. A semiconductor laser element as claimed in claim 5, wherein said unitary film is made of at least one member selected from the group consisting of silicon monoxide, silicon dioxide, silicon nitride, and aluminium oxide.

7. A semiconductor laser element as claimed in claim 6, wherein said unitary film forming step comprises the step of sputtering said at least one member simultaneously at least onto said reflection surfaces of said laser crystal and onto said exposed portion of said fusible metal layer.

8. A semiconductor laser element as claimed in claim 7, wherein said at least one member is sputtered to a thickness between several hundred angstroms and one thousand angstroms.

9. A method of manufacturing a semiconductor laser element comprising the steps of providing a semiconductor laser crystal having a pair of opposing reflection surfaces and a pair of opposing principal surfaces, forming a pair of ohmic contacts at least on predetermined areas of the respective principal surfaces, providing a heat sink having a planar surface wider than each of said principal surfaces of said laser crystal, forming a layer of a fusible metal on said planar surface of said heat sink, fusing at least a portion of said fusible metal layer to fuse the layer crystal having said contacts to said heat sink with one of said contacts brought into contact with a predetermined portion of said fusible metal layer, and forming a unitary film of an electrically insulating material which continuously covers at least said reflection surfaces of said laser crystal and the exposed portion of said fusible metal layer which is left uncovered by said laser crystal fused to said heat sink, said fusible metal being fusible at a temperature below about 370° C.

10. A method as claimed in claim 9, wherein said electrically insulating material is at least one member selected from the group consisting of silicon monoxide, silicon dioxide, silicon nitride, and aluminium oxide.

11. A method as claimed in claim 10, wherein said unitary film forming step comprises the step of sputtering said at least one member simultaneously at least onto said reflection surfaces of said laser crystal and onto said exposed portion of said fusible metal layer.

* * * * *